United States Patent [19]
Kato et al.

[11] Patent Number: 5,850,094
[45] Date of Patent: Dec. 15, 1998

[54] SEMICONDUCTOR DEVICE

[75] Inventors: Katsuhiro Kato; Yasuhiro Fukuda, both of Tokyo, Japan

[73] Assignee: Oki Electric Industry Co., Tokyo, Japan

[21] Appl. No.: 749,357

[22] Filed: Nov. 20, 1996

[30] Foreign Application Priority Data

Nov. 21, 1995 [JP] Japan ................................. 7-302706

[51] Int. Cl.$^6$ .................................................. H01L 23/62
[52] U.S. Cl. ............................................................ 257/355
[58] Field of Search ............................................. 257/355

[56] References Cited

U.S. PATENT DOCUMENTS 5,075,691  12/1991  Garay et al. .
5,495,118   2/1996  Kinoshita et al. .

FOREIGN PATENT DOCUMENTS 62-68319  3/1987  Japan .

Primary Examiner—Stephen Meier
Attorney, Agent, or Firm—Rabin & Champagne, P.C.

[57] ABSTRACT

The present invention relates to a semiconductor device which utilizes a first conduction MOS output transistor 11 as an output transistor. The inventive semiconductor device have a advantage that the occupied area of an electrostatic breakdown preventing circuit is smaller than that of the conventional device, and the resistance against the electrostatic breakdown is better than that of the conventional device, and further an additional manufacturing process is not required, thereby obtaining the semiconductor device with an improved resistance. The inventive device is formed that a second conduction MOS transistor 13 functions as an electrostatic breakdown preventing circuit, with a drain of which being connected to an output terminal 15, and connected in a parallel form with the output transistor.

50 Claims, 9 Drawing Sheets

SEMICONDUCTOR DEVICE

BACKGROUND OF THE INVENTION

1. Field of the Invention

The present invention relates to a semiconductor device, and more particularly, to a semiconductor device having an electrostatic breakdown preventing circuit for a MOS output transistor for surppressing a reverse electrostatic surge flowing from an output terminal to the output transistor, thereby enhancing a resistance against the electrostatic surge applied thereto.

2. Description of the Related Art

Generally, a Complementary MOS-Integrated Circuit (hereinafter referred to as a CMOS IC) is well known as the semiconductor device which is most advantageous for a low power consumption and a high density. In the CMOS IC, both a P channel MOS transistor and a N channel MOS transistor are formed on the same substrate, and the drains in both MOS transistors are commonly connected to a conductive line, thereby obtaining the low power consumption and the high density.

In one MOS transistor, the portion which is connected to an output line is called the drain and the portion which is coupled with the power supply VDD or the ground VSS is referred to as the source. Specifically, the carrier input side is called the source and the output side is referred to as the drain. However, it should be pointed out that the source and drain in all MOS transistors are variable.

Recently, the CMOS IC described above suffers from the disadvantage that an output transistor may be broken down by an electrostatic surge applied thereto. Such a problem is basically caused by a shallow impurity diffused layer and the reduced dimensions of elements according to a high speed and high integrated semiconductor device. For this reason, a conventional MOS type protecting transistor with the same conductive transistor as the output transistor has been used and it has been connected to the output transistor in a parallel form, wherein a gate of which is turned off, to form an electrostatic breakdown preventing circuit. Since it is difficult for the CMOS IC to overcome the surge voltage using only the output transistor, there has been introduced the protecting transistor so as to cope with the disadvantage by dividing the applied surge into both the output transistor and the protecting transistor.

However, in a PN junction of the semiconductor device, since the resistance against the electrostatic surge in the reverse direction (referred to as "reverse electrostatic surge" hereinafter) is generally lower than the resistance against the electrostatic surge in the forward direction (referred to as "forward electrostatic surge" hereinafter), the protecting transistor was added to withstand against the reverse electrostatic surge in the conventional technique.

The characteristic of the reverse electrostatic surge in the MOS transistor will be described in detail with reference to FIG. 12. Referring to FIG. 12, (a) represents the characteristics of drain current ID vs. VD drain voltage in a MOS transistor manufactured by processes for a high voltage use, and (b) illustrates the characteristic of ID-VD in a MOS transistor fabricated by processes for general use, in particular characteristics appearing near the breakdown voltage.

As shown in FIG. 12, regardless of the high voltage use or the general use, if a reverse bias is supplied to a PN junction formed between a drain of the MOS transistor and a substrate(or a well), an avalanche phenomenon occurs at the point at which the bias exceeds the source-drain breakdown voltage (BVsd), resulting in flowing of a drain current, in turn, the drain current is fed to a negative resistance region (the region in which the drain voltage is decreased and the drain current is increased) according to the increase of the reverse bias. Thereafter, the characteristics of a constant voltage region in which the drain current is steeply varied in response to a tiny variation of the drain voltage appears.

Accordingly, as can be seen in FIG. 12, in the MOS transistor, if the voltage at which a reverse surge current begins to flow is called an operation starting voltage, then it corresponds to the aforementioned breakdown voltage BVsd in the source-drain region. In addition, the electrostatic breakdown in the MOS transistor occurs due to the joule heating (product of drain current and holding voltage) introduced by the surge current. The greater the joule heating, the greater the electrostatic breakdown.

The holding voltage corresponds to the drain voltage Vhb or Vha which represents the constant voltage region in FIG. 12. The holding voltage generally is in a positive relationship to the source-drain breakdown voltage BVsd. A MOS transistor fabricated by a process for providing a high breakdown voltage BVsd in the source-drain region has a high holding voltage. In other words, in the MOS transistor, the higher the operation starting voltage (the voltage at which a reverse surge current begins to flow), the higher a likelihood of the voltage breakdown.

Therefore, in the above described conventional constitution, only it is different that the output transistor and the protecting transistor are combined, and otherwise they are of the same constitution. Thus, the two transistors perform the same operation against the electrostatic surge. That is, the output transistor and the protecting transistor perform the same operation against the reverse electrostatic surge. If the reverse electrostatic surge is not high enough to exceed the breakdown voltage BVsd of the source-drain region of the output transistor, the protecting transistor does not start to operate. Since the output transistor suffers from a voltage breakdown during the operation, the electrostatic breakdown of the output transistor occurs.

One method has been proposed to avoid the electrostatic breakdown by setting some different holding voltages of both the output transistor and the protecting transistor. However, such method has the drawbacks that it is a complex and cumbersome process since the manufacturing process steps should be changed.

In the semiconductor device using the conventional technique, a protecting transistor having the same structure as the output transistor is coupled with the output transistor in a parallel form, so that the junction area would be increased, and that the heating amount per unit area would be reduced, thereby preventing the electrostatic breakdown. If it is to be coped with in the case of a shallow junction of the output transistor or in the case of a process giving a high breakdown voltage, the increase of the occupied area of the protecting transistor cannot be avoided. Consequently, there is the problem that the chip price is increased.

More specifically, such a device suffers from defects that the junction area of the protecting transistor is needed to be expanded as much as the reduction of the junction area of the output transistor, i.e., as much as the reduction due to the shallow junction, and further the protecting transistor has to secure a junction area large enough to cope with the holding voltage which has been so much increased in order to correspond to the process having a high breakdown voltage.

SUMMARY OF THE INVENTION

It is, therefore, a primary object of the present invention to provide a semiconductor device which is capable of activating a switching device acting as an electrostatic breakdown preventing circuit at a reverse electrostatic surge voltage lower than the source-drain breakdown voltage of an output transistor, resulting in minimum influence of the surge to the output transistor, thereby preventing the voltage breakdown of the output transistor.

It is another object of the present invention to provide a semiconductor device in which the voltage breakdown preventing circuit is formed together with the output transistor without modifying the manufacturing process for the semiconductor device, wherein the voltage breakdown preventing circuit has a greater resistance against the electrostatic surge compared with the conventional electrostatic breakdown preventing circuit.

It is still another object of the present invention to provide a semiconductor device which is capable of using a MOS transistor or a bipolar transistor as the protecting transistor, thereby reducing the occupied area of the protecting transistor and obtaining the protecting transistor with the improved resistance against the electrostatic breakdown.

It is still another object of the present invention to provide a semiconductor device which can be applied to various semiconductor devices utilizing a MOS transistor as the output transistor.

It is still another object of the present invention to provide a semiconductor device which can be applied to a semiconductor device with a structure that a pair of the output transistors with a first and a second conductive output transistor is connected in a parallel form with the output terminal of the semiconductor device, thereby obtaining a protecting transistor with an improved resistance against the breakdown voltage.

In accordance with the present invention, there is provided a semiconductor device comprising a first conductive MOS output transistor with any one of a source and a drain connected to an output terminal of the semiconductor device, and an electrostatic breakdown preventing means for protecting the output transistor from the electrostatic breakdown introduced by electrostatic surge current, wherein the electrostatic breakdown preventing means is a second conductive semiconductor switching transistor connected to the output transistor in a parallel form and one end connected to the output terminal.

With the above described constitution, when a reverse electrostatic surge occurs in the output terminal of the semiconductor device around the output transistor, the semiconductor switching device of a second conductive transistor is activated at a level at which the electrostatic surge voltage is lower than the breakdown voltage of the output transistor. As a result, in the output transistor of the semiconductor device, the adverse influence that the reverse electrostatic surge makes to the output transistor can be alleviated in comparison with the conventional technique.

Meanwhile, when manufacturing the semiconductor device, it is the general practice that the semiconductor switching device of a second conductive transistor is formed at an arbitrary position on a substrate in view of the constitution of the circuits. Therefore, the formation process for the semiconductor switching device of a second conductive transistor is included in the formation process for the semiconductor device in fact.

Therefore, the semiconductor switching device of a second conductive transistor can be manufactured without adding any special facility. The above objects and other advantages of the present invention will become more apparent by describing in detail the preferred embodiments of the present invention shown in the accompanying drawings.

DETAILED DESCRIPTION OF THE PREFERRED EMBODIMENT

There are a plurality of possible embodiments of the semiconductor device according to the present invention, and the most important ones will be described below in detail. By describing these embodiments, the objects, characteristics and advantages of the present invention will become more apparent.

Now referring to the attached drawings, the embodiments of the present invention will be described. In the following embodiments, it is assumed that the semiconductor substrate is a P type silicon substrate.

1. First embodiment

Figure 1:
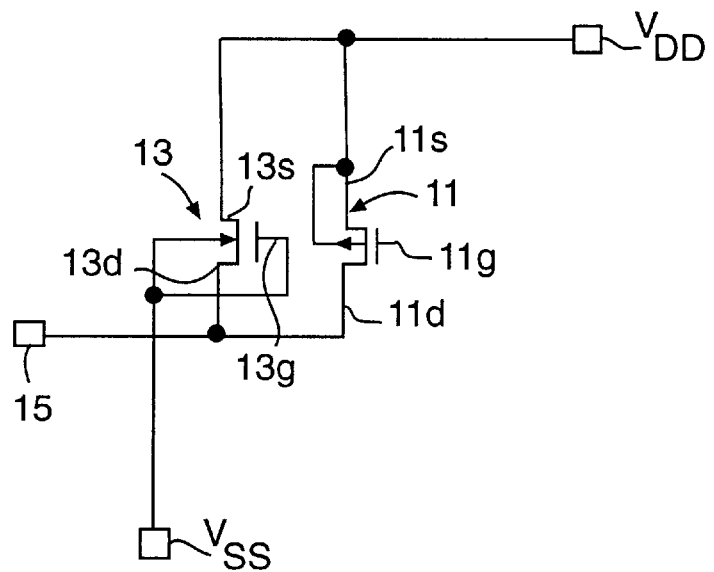
FIG. 1 illustrates a first embodiment of the semiconductor device according the present invention, in which the output transistor is a PMOS transistor.

FIG. 1 illustrates a first embodiment of the semiconductor device in accordance with the present invention, which comprises a first conductive transistor 11 for an output and a second conductive transistor 13, wherein the first transistor 11 is a PMOS type and the second transistor 13 is an NMOS type, termed a protecting transistor.

The first conducting transistor 11 to be protected from an electrostatic surge applied thereto is installed so that a drain 11d thereof is connected to an output pad 15 which functions as an output terminal of the device, a source 11s and an N well are coupled with a first power supply VDD, and a gate 11g is connected to a predetermined signal line (not shown).

Meanwhile, the second conductive transistor 13, which acts as a switching device, is installed so that a drain 13d is connected to the output pad 15, a source 13s is coupled with the first power supply VDD, and a gate 13g is connected to a second power supply VSS which allows turning off the second conductive transistor 13 during the normal operation. Here a substrate is connected to the second power supply Vss. Thus the first and the second transistors, 11 and 13, are provided between the output pad 15 and the first power supply VDD in a parallel form.

Figure 13:
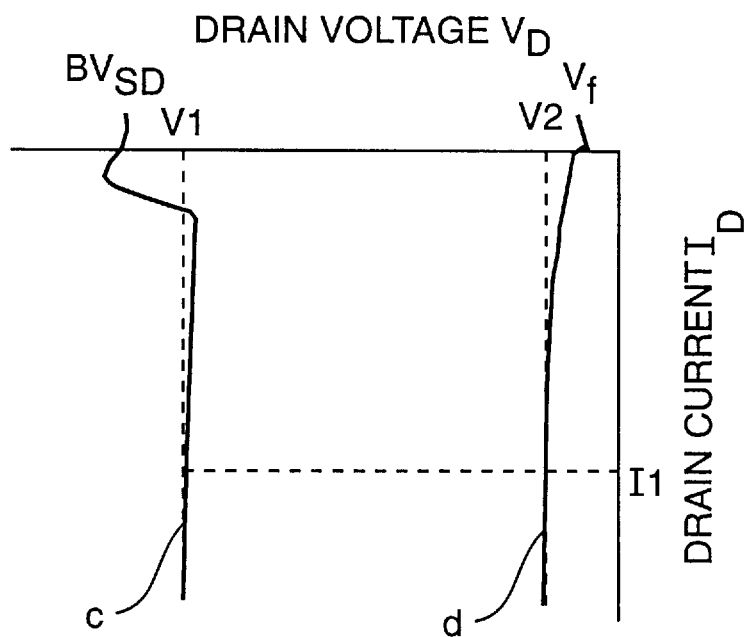
FIG. 13 shows a supplemental illustration of the first embodiment of the semiconductor device according to the present invention.

In the first embodiment in accordance with the invention, descriptions for an electrostatic surge applied to the output pad 15, will be described with reference to FIG. 13. Referring to FIG. 13, c represents the characteristics between a drain current ID and a drain voltage VD, wherein direction of which is backward, and d depicts the characteristics between a drain current ID and a drain voltage VD, wherein direction of which is forward.

In the semiconductor device of the preferred first embodiment, the transistor to be protected is the first transistor 11. In the first transistor 11, a reverse electrostatic surge occurs when a negative electrostatic surge is supplied to the output pad 15 with respect to the first power supply VDD.

When the negative electrostatic surge is applied to the output pad 15, the operation starting voltage of the first transistor 11 is equivalent to the breakdown voltage (hereinafter referred as "BVsd") between the source and the drain as shown in FIG. 13.

Accordingly, if the second transistor 13, i.e., NMOS transistor, which acts as the protecting transistor is not provided therein, the surge current flows via the drain 11d to the source 11s of the first transistor 11 when a voltage of the electrostatic surge exceeds the BVsd.

Since the electrostatic surge becomes forward in a PN junction between the drain 13d of the second transistor 13 and the substrate, the operation starting voltage of the electrostatic breakdown preventing circuit is equal to a flat band voltage, Vf, of the PN junction in the second transistor 13. The voltage Vf is about 0.6 V if the substrate is made of a silicon substrate and also has a constant value regardless of the impurity concentration. Thus, when the electrostatic surge exceeds the voltage Vf, the surge current is dispatched to the source 13s through between the drain 13d of the second transistor 13 and the substrate.

In the occasion, since Vf<BVsd, in turn, a substantial amount of the surge current flows through the second transistor 13, thereby significantly lowering the adverse influence to the first transistor 11 according to the reverse electrostatic surge in contrast with the conventional technique. In addition, as shown in FIG. 13, if when the second transistor 13, i.e., NMOS transistor, is not provided therein, a holding voltage of the first transistor 11 is V1, its current is I1, and a drain voltage which can allow the I1 to flow through the second transistor 13 is V2, a relationship of the holding voltage V1 and the drain voltage V2 becomes V2<V1.

For this reason, the joule heating (multiplication between a drain voltage and a drain current) under the same current is small at the side of the second transistor 13, and is large at the side of first transistor 11. Specifically, if both the first and the second transistor, 11 and 13, having the same area are broken by the same joule heating, the second transistor 13 has a higher resistance against the applied electrostatic surge at a smaller area in comparison with the first transistor 11.

As described above, in the semiconductor device of the first embodiment in accordance with the present invention, since the MOS transistor with an opposite conductive transistor to that of the output transistor is used as the protecting transistor, the operation starting voltage of the protecting transistor for the reverse electrostatic surge in the output transistor corresponds to the flat band voltage Vf. Since the flat band voltage Vf is smaller than the operation starting voltage BVsd in the conventional technique, the protecting transistor is activated earlier than the output transistor during the application of the reverse electrostatic surge to the device. The voltage supplied to the drain during the operation thereof is also lower than the holding voltage of the conventional protecting transistor with the same conductive transistor. Therefore, it is possible to reduce the joule heating based on the applied surge current, thereby obtaining an improved resistance against the voltage breakdown.

Likewise, the first embodiment in accordance with the invention has advantages that an additional process is not required during the manufacturing process of CMOS-IC, and it may be achieved by various pattern designs. In the first embodiment, an experiment has been performed as below in order to reduce the occupied area of the protecting transistor in the device. If a width of the gate in the first transistor 11 acting as the output transistor is 40 m, and a width of the gate in the second transistor 13 functioning as the protecting transistor is 80 m, the breakdown voltage based on MIL-STD-3015.7 standard for the electrostatic breakdown test is 1700 V.

Meanwhile, in another example, if both the output and the protecting transistors are a PMOS type of transistor, and the sum of the gate widths in both transistors is 300 m, the breakdown voltage based on MIL-STD-3015.7 standard for the electrostatic breakdown test is only 1400 V.

Accordingly, in the present invention, it is possible to reduce the occupied area of the protecting transistor and obtain an enhanced resistance in comparison with the conventional device.

Figure 2:
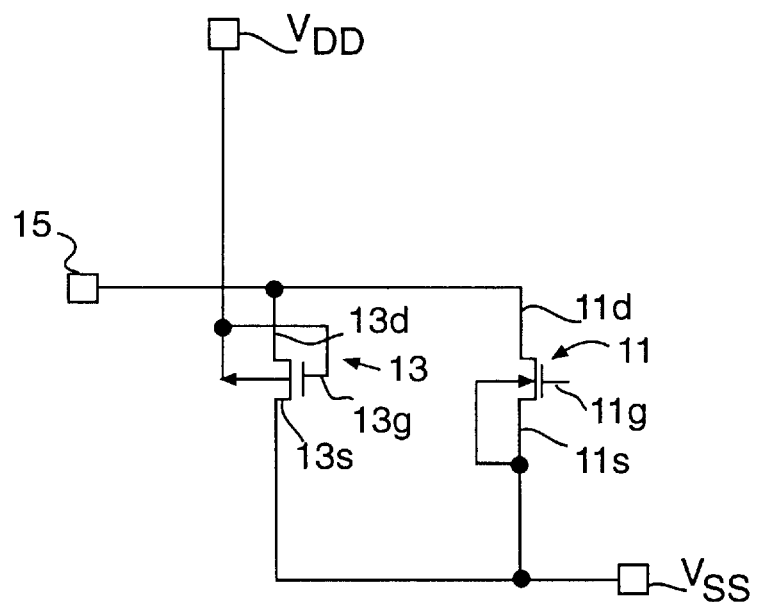
FIG. 2 illustrates another example of the first embodiment of the semiconductor device according to the present invention, in which the output transistor is an NMOS transistor.

In addition, even if a transistor acting as the output transistor is an NMOS transistor, and transistor acting as the protecting transistor is a PMOS transistor as shown in FIG. 2, the invention may be implemented. More specifically, the second transistor 11, i.e., NMOS transistor to be protected is installed in such a manner that a drain 11d thereof is connected to an output pad 15 functioning as an output terminal of the semiconductor device, the source 11s and the substrate are coupled with the second power supply VSS and a gate 11g is connected to a signal line (not shown).

Meanwhile, the first transistor 13 which acts as the protecting transistor, i.e., PMOS transistor, is installed in such a manner that a drain 13d is connected to the output pad 15, a source 13s is coupled with the second power supply VSS, and a gate 13g and an N well are connected to the first power supply VDD, wherein the VDD is a potential which allows turning off the first transistor 13 during the normal operation.

2. Second embodiment

Figure 3:
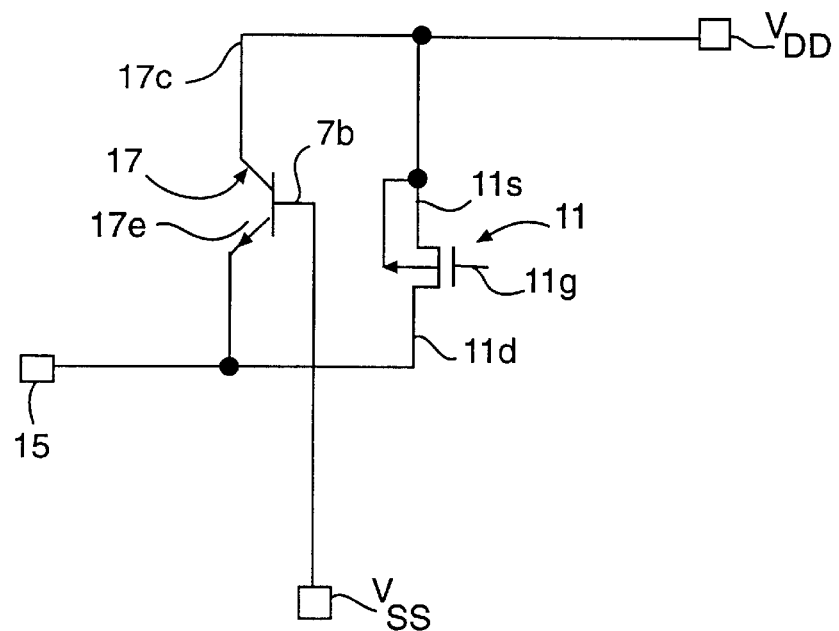
FIG. 3 illustrates a second embodiment of the semiconductor device according to the present invention, in which the output transistor is a PMOS transistor.

Referring to FIG. 3, there is shown a semiconductor device in accordance with a preferred second embodiment of the present invention, which comprises a PMOS transistor 11 acting as an output transistor and an NPN type bipolar transistor 17 acting as a protecting transistor or a semiconductor switching device. The connection of the PMOS transistor 11 and the output pad 15 to other components is the same as that described in connection with the first embodiment of FIG. 1.

Meanwhile, the NPN transistor 17 acting as the protecting transistor is installed in such a manner that an emitter 17e thereof is connected to the output pad 15, a collector 17c is coupled with the first power supply VDD, and a base 17b is connected to the second power supply VSS, wherein the VSS is a potential which allows the NPN transistor 17 to be turned off during the normal operation. Thus, the connection between the PMOS transistor and the NPN transistor 17 is in a parallel form between the output pad 15 and the first power supply VDD.

In the semiconductor device in accordance with the preferred second embodiment of the invention, if an electrostatic surge which allows the output pad 15 to become a negative pole is supplied to the output pad 15 since the PN junction between the emitter and the base in the NPN transistor 17 is forward, resulting in flowing of a base current between the emitter and the base in the NPN transistor 17 when the applied electrostatic surge exceeds the voltage Vf.

If the base current flows to turn on the NPN transistor 17, a collector current flows between the emitter 17e and the collector 17c.

Since this collector current is several times or several scores of times as large as the base current of the general NPN transistor, a substantial amount of the surge current is applied to the source 11s of the first transistor 11 as the collector current. Specifically, it should be pointed out that since the flat band voltage Vf is smaller than the operation starting voltage BVsd, the substantial amount of the surge current flows through the NPN transistor 17, and not through the PMOS transistor 11.

As aforementioned, in the semiconductor device in accordance with the second embodiment of the present invention, since the bipolar transistor with the emitter and the collector which are made of semiconductor layers of an opposite conductive transistor in contrast with that of the output transistor is employed as the protecting transistor, the operation starting voltage of the protecting transistor for the reverse electrostatic surge corresponds to the voltage Vf.

Since the flat band voltage Vf is smaller than the operation starting voltage BVsd in the conventional technique disclosed, the protecting transistor is activated prior to the output transistor during the application of the reverse electrostatic surge to the device, and the holding voltage during the operation is also lower than that of the conventional protecting transistor with the same conductive transistor. Accordingly, it is possible to reduce the joule heating based on the applied surge current, thereby obtaining a resistance against the voltage breakdown.

Likewise, in the second embodiment of the invention, since the bipolar transistor is used as the protecting circuit, a gate electrode is not required, in turn, a gate potential need not to be supplied, thereby making it possible to reduce the occupied area of the protecting transistor in the device in comparison with the first embodiment.

Figure 4:
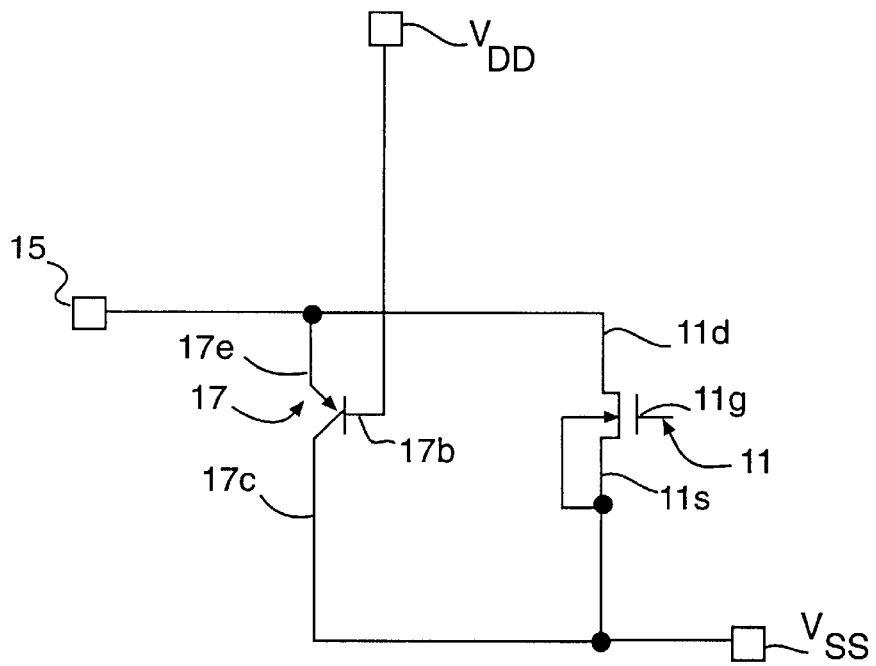
FIG. 4 illustrates another example of the second embodiment of the semiconductor device according to the present invention, in which the output transistor is an NMOS transistor.

In addition, as presented in FIG. 4, the invention is capable of altering the output transistor into an NMOS transistor, and the protecting transistor into a PNP type bipolar transistor. In other words, the NMOS transistor 11 to be protected is provided in such a manner that a drain 11d thereof is connected to an output pad 15, the source 11s and the substrate are coupled with the second power supply VSS, and a gate 11g is connected to a signal line (not shown).

Meanwhile, the PNP transistor 17 acting as the protecting transistor is installed in such a way that an emitter 17e, a collector 17c and a base 17b are coupled with the output pad 15, the second power supply VSS and the first power supply VDD, respectively, wherein the VDD is a potential which allows the PNP transistor 17 to be turned off during the normal operation.

3. Third embodiment

Figure 5:
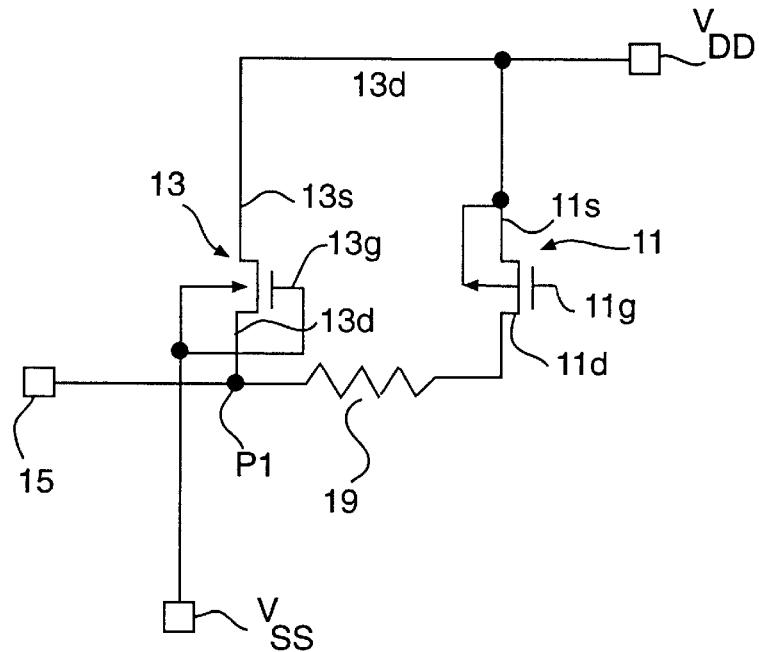
FIG. 5 illustrates a third embodiment of the semiconductor device according to the present invention, in which a single output transistor is provided.

Referring to FIG. 5, there is shown a semiconductor device in accordance with a preferred third embodiment of the present invention.

As shown in FIG. 5, in the device of a third embodiment, a resistance 19 for suppressing flowing of the applied surge current to the output transistor is disposed therebetween in addition to both the output transistor 11 and the protecting transistor functioning as a switching device which is connected in a parallel form.

The drain 11d of the output transistor 11 is connected to a connecting point P1 between the drain 13d of the protecting transistor 13 and the output pad 15, through the resistance 19 interposed therebetween.

Specifically, the presence of the resistance 19 between the drain 13d of the protecting transistor 13 and the drain 11d of the output transistor 11 shows that the electrostatic surge which is applied to the output pad 15 prevents from flowing to the output transistor 11, and also increases flowing of the surge to the protecting transistor 13.

Consequently, in comparison with the first and the second embodiment discribed above, the semiconductor device in accordance with the third embodiment has a merit that the output transistor can be more effectively protected by the protecting transistor.

Furthermore, the third embodiment is further effective where the output transistor to be protected has a smaller area. Since the larger the value of the resistance 19 is, the greater the protecting effect is and the well resistance having a high resistivity can be used as it is, there is no disadvantage that the occupied area of the protecting circuit in the device is increased for disposing the resistor.

Further, it is should be further noted that the resistance 19 can be applied to the bipolar transistor which utilized as the protecting transistor shown in FIG. 3.

Figure 6:
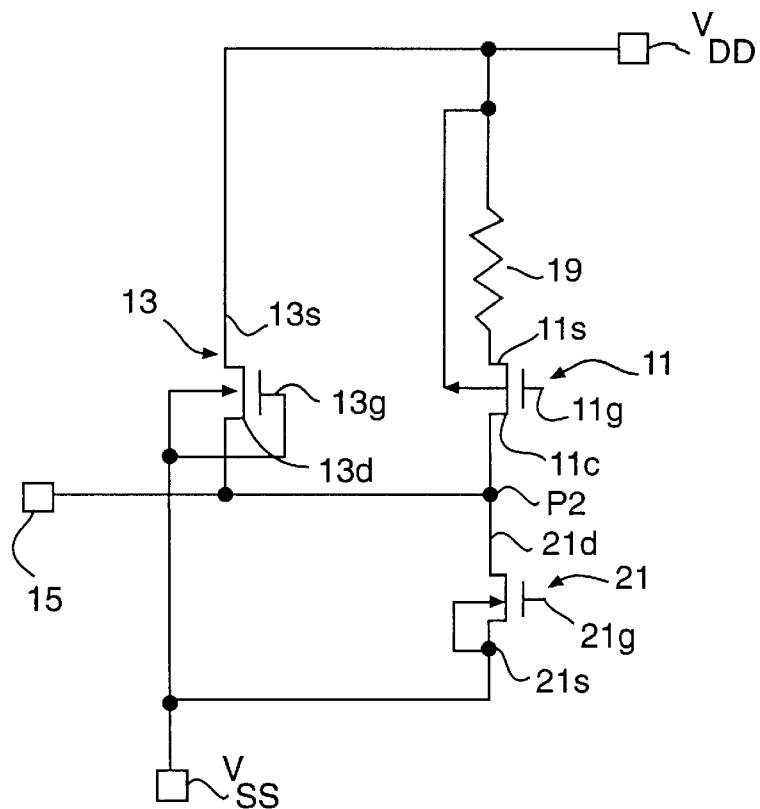
FIG. 6 illustrates another example of the third embodiment of the semiconductor device according to the present invention, in which a plurality of output transistors are provided.

When a plurality of output transistors are connected to the output pad 15 in a parallel form as shown in FIG. 6, the resistance is preferably disposed where output transistors other than the output transistor 11 to be protected are not affected.

Referring to FIG. 6, both the first output transistor 11 (PMOS type) and the second output transistor 21 (NMOS type) are coupled with the output pad 15 in a parallel form. In this occasion, the resistance is installed at a side of the first output transistor 11 as observed from a connection point P2 between the drains in the first and the second output transistors, 11 and 21.

In FIG. 6, there is shown the resistance 19 installed between the source 11s of the first output transistor 11 and the first power supply VDD. Instead of the example of FIG. 6, the resistor may be interposed between the drain 11d of the first output transistor 11 and the connection point P2.

4. Fourth embodiment

Figure 7A:
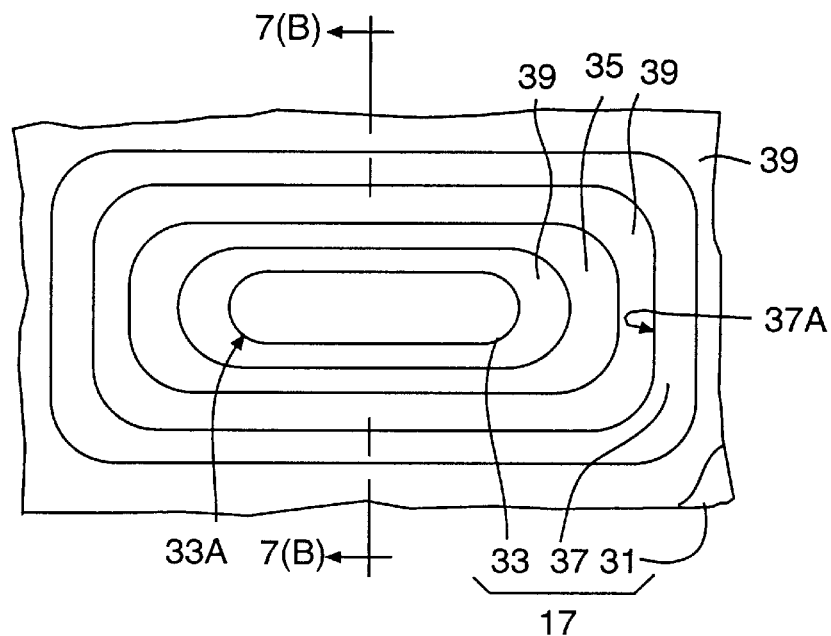
FIG. 7 illustrates a fourth embodiment of the semiconductor device according to the present invention.
Figure 7B:
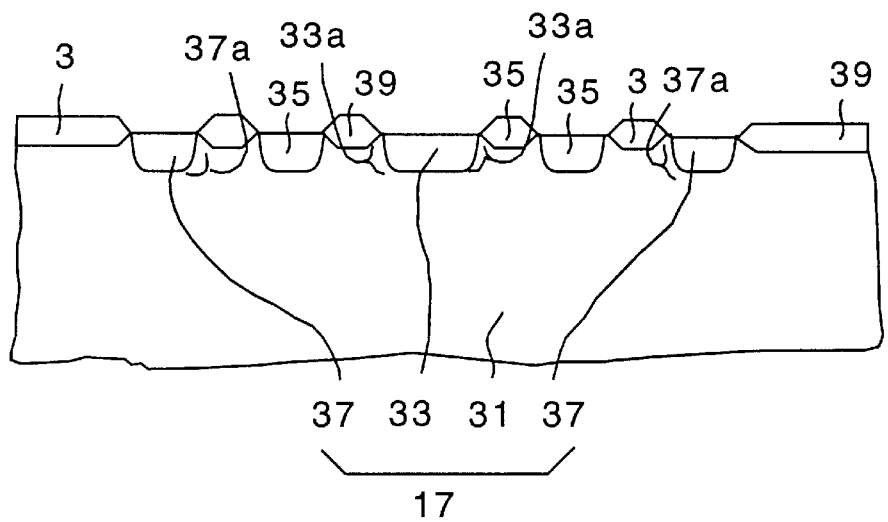

Referring to FIGS. 7(A) and 7(B), there is shown an example of semiconductor device formed in a structure for suppressing the joule heating caused by the electrostatic surge current in the protecting transistor, in accordance with a perferred fourth embodiment of the present invention.

Preferably, when a bipolar transistor is used as the protecting transistor (e.g., the second embodiment), the collector junction area should be designed by taking into account the heating depending on the electrostatic surge current. More specifically, the collector junction area should be perferably expanded as far as possible.

Therefore, instead of the NPN transistor 17 in the second embodiment, the fourth embodiment of the present invention employs a lateral type NPN transistor. Details of the lateral type NPN transistor are as follows.

FIGS. 7A and 7B explain a plan view of the main portion of the transistor and a cross-sectional view taken on line I—I of FIG. 7A, respectively.

Specifically, an N type impurity diffused region 33 is first formed upon a P type silicon substrate 31 to serve it as an emitter. Thereafter, a P type impurity diffused region 35 which surrounds the N type impurity diffused region 33 is formed to act it as an ohmic contact for a base, and an N type impurity diffused region 37 is then formed so as to encompass the region 35, which functions as a collector. The P type silicon substrate 31 acts as a base, and reference numerals 39 in FIGS. 7A and 7B, represents a field oxide film.

In the transistor 17 with such structure, since an interface between collector-base junctions becomes an inner boundary face 37a of the N type impurity diffused region 37, and an interface between emitter-base junctions becomes an outer boundary 33a of the N type impurity diffused region 33, the collector-base junction can have a sufficiently wide area which can be less prone to introduce heating depending on an electrostatic surge current.

The determination of the area of collector junction is performed theoretically or experimentally according to the semiconductor device.

In the fourth embodiment, respective impurity diffused regions are electrically connected to a metal, for example, aluminum A1, conductive layer through contact holes, and further are coupled with the outside by means of a bonding pad.

As described above, since a negative reverse electrostatic surge in the PMOS transistor 11 to be protected becomes forward at the PN junction between the emitter and the base of the NPN transistor 17, the operation starting voltage for the electrostatic surge in the NPN transistor 17 becomes the voltage Vf.

Similarly, at a time point when the electrostatic surge exceeds the Vf, a base current flows to the NPN transistor 17, and therefore a collector current which corresponds to several times or several scores of times as large as the base current flows to the transistor 17.

Figure 8:
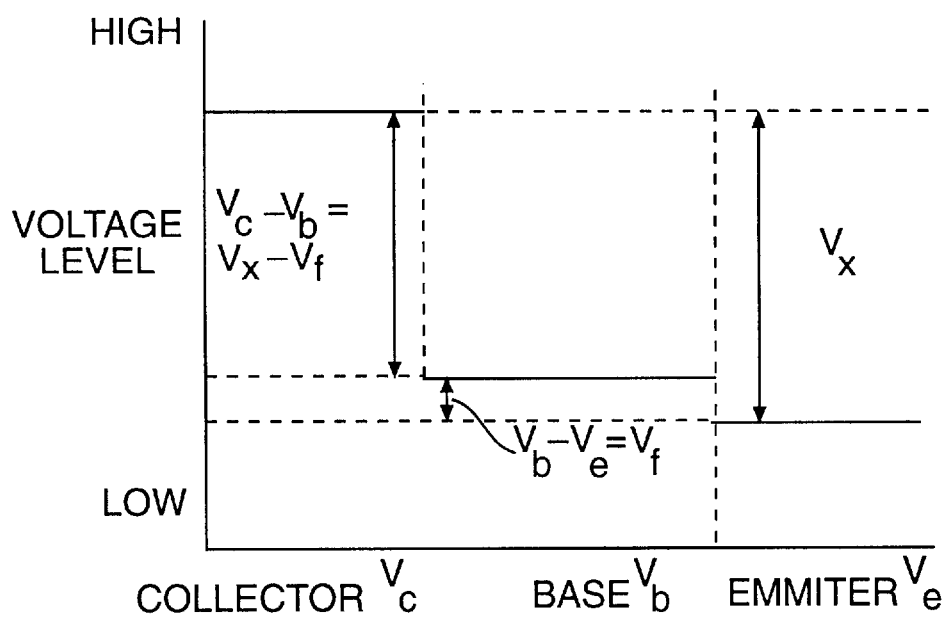
FIG. 8 shows the operation of the fourth embodiment.

Referring to FIG. 8, there is shown a graph representing potentials on each node in the NPN transistor 17, when the electrostatic surge voltage is indicated by Vx, in which a substantial amount of the surge voltage Vx is applied to interface between the collector and the base. This means that, when the collector current flows, the potential difference between the collector and the base is far greater than that between the emitter and the base, and further that the joule heating defined by product of a current and a voltage is greater than in the collector-base junction.

Accordingly, in the fourth embodiment, since an area of the collector-base junction area is designed to be large by the joule heating, most of joule heating introduced at the collector-base junction can be spread over the large junction area thereon, resulting in lowering the joule heating per unit area, thereby obtaining an improved resistance against the electrostatic damages. Particularly, in the fourth embodiment, to reduce the occupied area of the protecting transistor, a circular bipolar transistor is used as the protecting transistor, thereby making it possible to manufacture a semiconductor device having an enhanced resistance characteristics against the electrostatic breakdown.

In the above described example, while the lateral bipolar transistor is used as the protecting transistor, the conception that the collector junction area is designed by heating caused by the electrostatic surge can be applied to the case where a longitudinal bipolar transistor is utilized as the protecting transistor.

5. Fifth embodiment

Figure 9A:
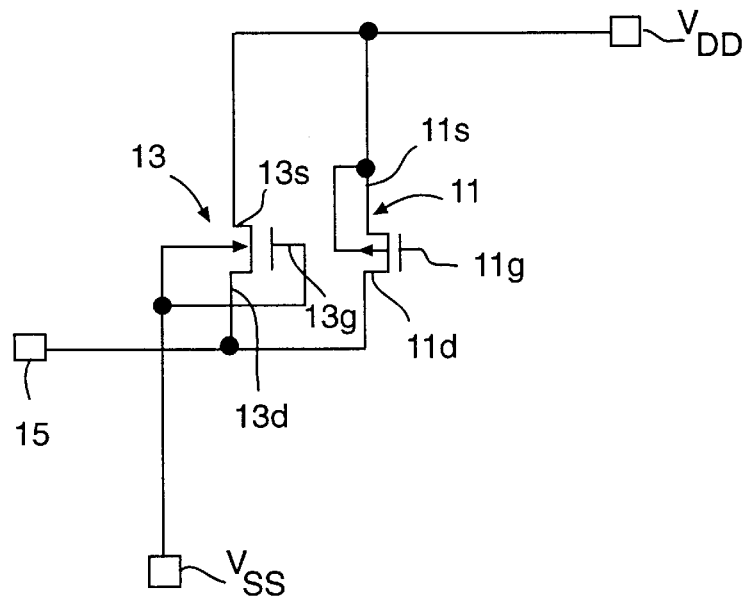
FIG. 9 illustrates a fifth embodiment of the semiconductor device according to the present invention, in which the protecting transistor is a MOS transistor.

Referring to FIGS. 9(A) and 9(B3), there is shown a semiconductor device in accordance with a fifth embodiment of the present invention. In the fifth embodiment, influence of the conductive metals incorporated in the device to further prevent the electrostatic breakdown will be described with reference to the following two examples.

In one example in accordance with the fifth embodiment, when a MOS transistor is used as a protecting transistor wherein types of the MOS and an output transistor is opposite from each other, preferably, the distance from a connecting point between the wiring metal and a source—drain region other than a source—drain region connected to the output terminal in the semiconductor device to a side of the gate in the source-drain region is determined so that diffusion of the wiring metals depending on the heating introduced by the electrostatic surge current can be less prone to occur.

Figure 9B:
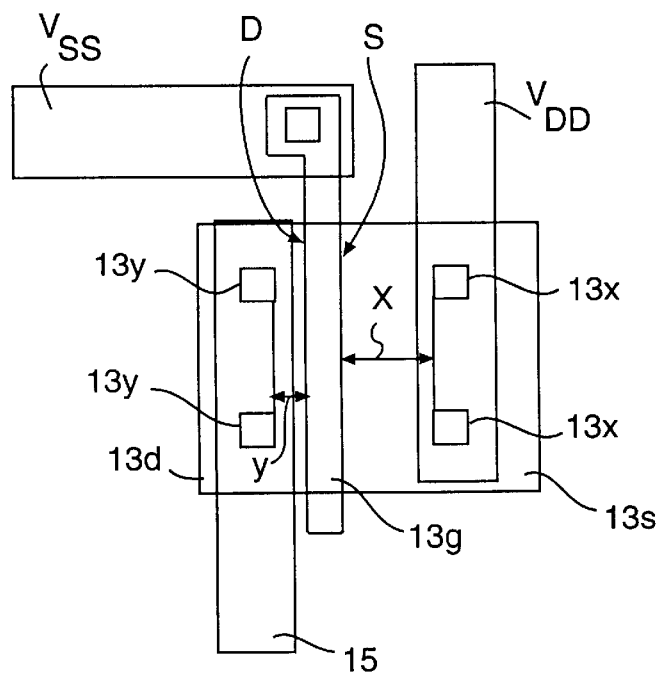

FIG. 9A shows a circuit of the semiconductor device similar to that of FIG. 1, and FIG. 9B provides a schematic view explaining an NMOS transistor 13 which serves as a protecting transistor disposed upon the silicon substrate. Thus, a pair of 13xs indicates a connection point (i.e., the contact holes) between a source 13s and a line for a first power supply VDD, and a pair of 13ys indicates a connection point between a drain 13d and a line for a second power supply VSS.

As shown in FIG. 9(B), the source 13s corresponds to a source-drain region other than the source-drain region connected to the output pad 15 in the semiconductor device. A distance x from the connection point 13x between the source 13s and the VDD line to one side of the gate 13g in the source—drain region in FIG. 9 (B) is made not to be affected by the diffusion of the conductive metal depending on the heating introduced by the electrostatic surge current.

Preferably, the distance x may be decided theoretically or experimentally according to the semiconductor device design. In the example, the distance x is larger than a distance y which corresponds to a distance from the connection points 13y between the drain 13d and the VSS line to one side of the gate 13g in the source-drain region. The conductive metal adjacent to the contact holes is melted by the introduced joule heating, and then is diffused to the substrate, and the electrostatic breakdown consequently occurs when melted metals cross interface of the PN junction.

In a MOS transistor shown in FIG. 9(B), S and D represent interface in the PN junction. Specifically, the interface S is provided at one side of the gate 13g adjacent to the sources 13s, and the interface D is provided at other side of the gate 13g adjacent to the drain 13d.

When a surge current flows through between the source and the drain in the NMOS transistor 13, the heating is generated on the junction interface between the source and the substrate rather than on that between the drain and the substrate, as described with reference to FIG. 8.

Therefore, the distance from the connection point 13x between the source 13s and the conductive metal to one side of the gate 13g, i.e., to the junction interface between the source and the substrate is made to be large, so that the meltable material is made to be remote from the heating source, and further, a larger surge current has to flow before the melted metal is diffused over the junction interface during the melting of the conductive metal. Owing to these two factors, an improved resistance against the electrostatic breakdown is obtained.

As described above, the first example of the fifth embodiment has a advantage that when the MOS transistor is used as the protecting transistor, the occupied area of the protecting transistor is reduced, thereby making it possible to obtain an enhanced resistance against the electrostatic breakdown.

Figure 10A:
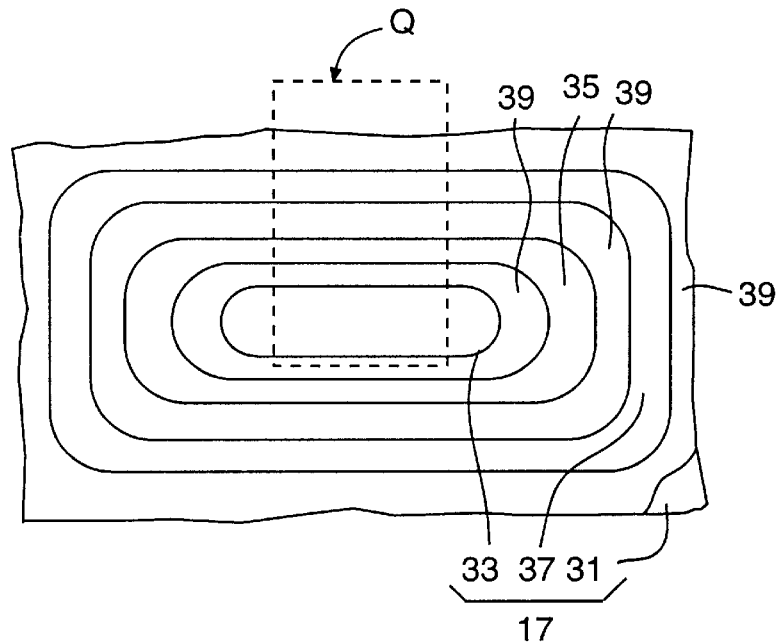
FIG. 10 illustrates another example of the fifth embodiment of the semiconductor device according to the present invention, in which the protecting transistor is a bipolar transistor.
Figure 10B:
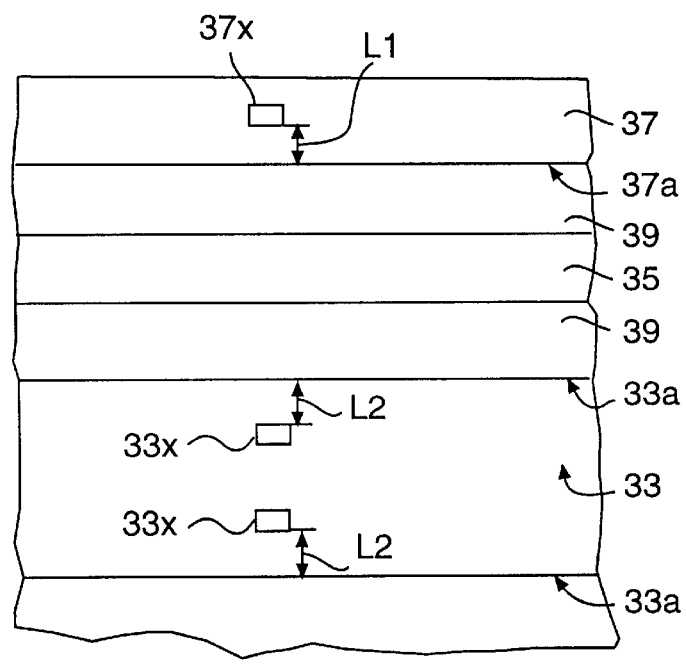

Referring to FIGS. 10(A) and 10(B), there is shown the second example in accordance with the fifth embodiment. FIG. 10A shows a plane view of the above described lateral NPN transistor, and FIG. 10B represents an enlarged view of the dotted rectangle portion Q of FIG. 10A.

When a bipolar transistor is utilized as a protecting transistor, preferably the distance from a connection point between a collector and a conductive metal connected thereto to the collector junction should be made not to be effected by the diffusion of the conductive metals depending on the heating introduced by the electrostatic surge current.

Referring to FIG. 10B, a distance L1 from a connection point 37x between an N type impurity diffused region 37 acting as a collector and a wiring metal connected thereto (not shown) to a collector junction 37a is made not to be affected by the diffusion of the conductive metals according to the heating introduced by the surge current.

Similarly, the distance L1 may be decided theoretically or experimentally, based on the semiconductor device design, wherein the distance L1 is preferably greater than a distance L2 from a connection point 33x between the N type impurity diffused region 33 acting as an emitter and a conductive metal connected thereto (not shown) to the emitter junction 33a.

The conductive metal adjacent to the connecting point is melted by the introduced joule heating, and then is diffused to the substrate. And the electrostatic breakdown consequently occurs when melted metals cross the junction interface, thus yielding an irrecoverable disorder.

In addition, in the case where the protecting transistor is the bipolar transistor, the heating introduced by the surge current is more generated on the collector-base junction interface rather than on the emitter-base junction interface, as described above referring to FIG. 8.

Therefore, the distance between the contact hole adjacent to the collector and the collector-base junction interface is made to be large, so that the meltable material is made to be remote from the heating source, and further, a larger surge current has to flow before the melted metal are diffused over the junction interface even in the case of melting of the conductive metals. Owing to these two factors, an improved resistance against the electrostatic breakdown is obtained.

As disclosed above, the second example of the fifth embodiment has a merit that when the bipolar transistor is employed as the protecting transistor, the occupied area of the protecting transistor is reduced, to thereby make it possible to obtain an improved resistance against the electrostatic breakdown.

Application of the semiconductor device in accordance with the preferred embodiments of the invention will be described with reference to Fig. 11.

As aforementioned above, in the present invention, it is possible to apply to various semiconductor devices which utilizes a first conduction type MOS transistor as an output transistor.

Figure 11:
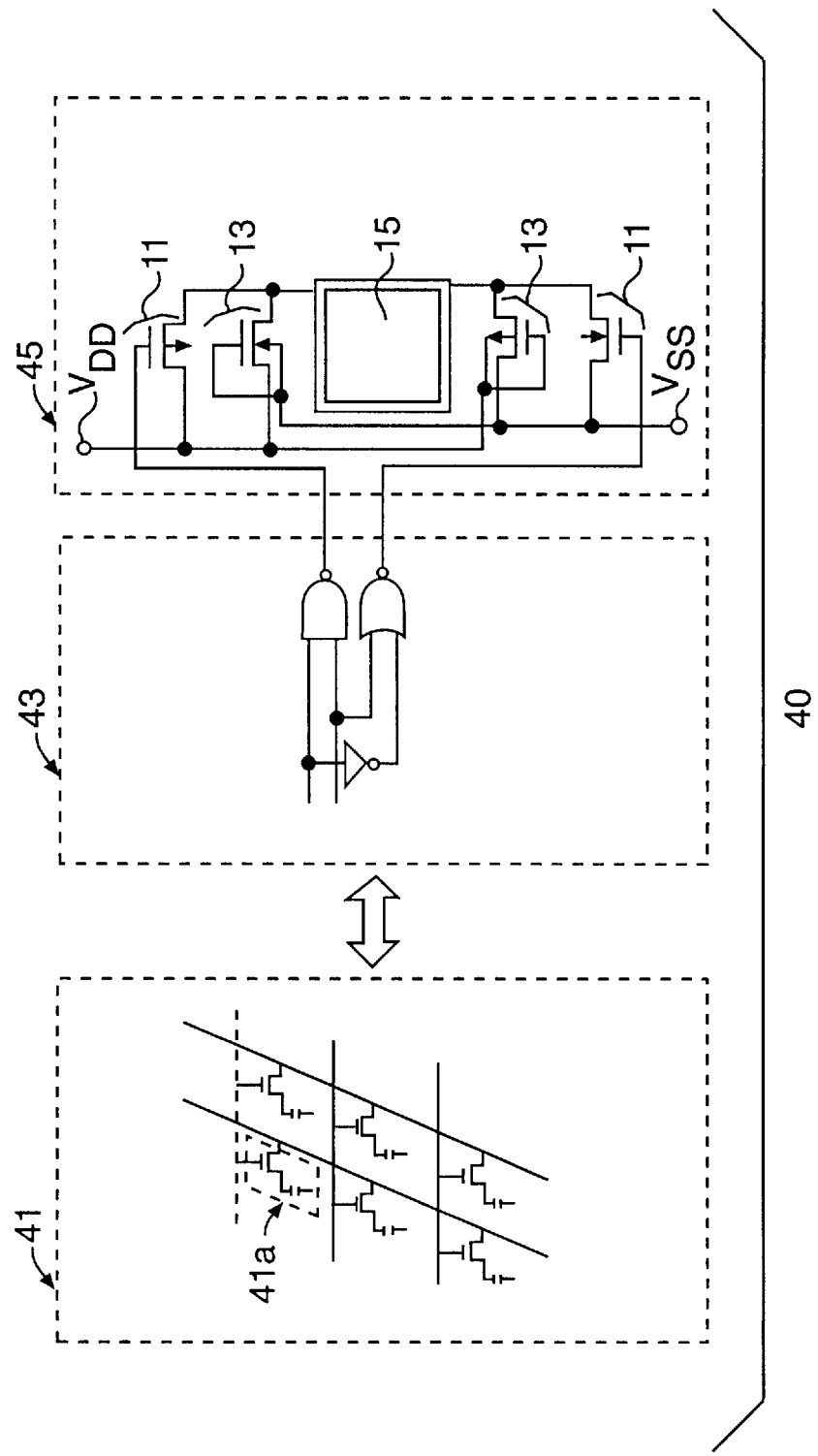
FIG. 11 shows an example to which the semiconductor device according to the present invention is applied.
Figure 12:
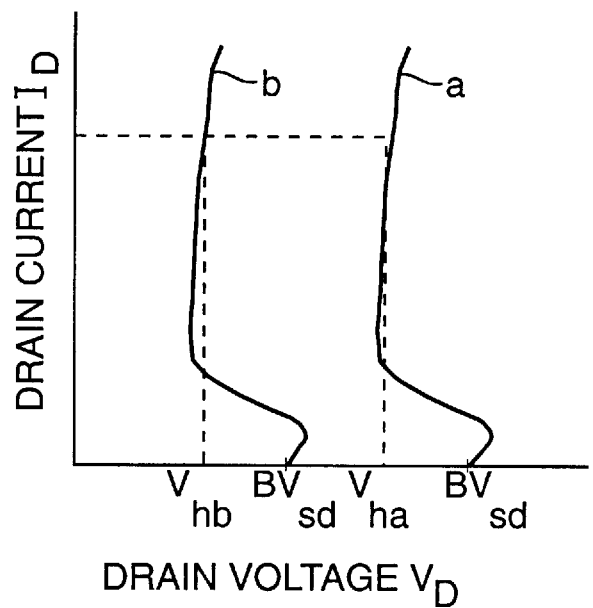
FIG. 12 illustrates the subject matter of the semiconductor device according to the present invention.

Referring to FIG. 11, there is shown an example explaining application of the present invention to a DRAM (dynamic random access memory). The DRAM 40 includes a memory cell array section 41 consisting of a plurality of memory cells 41a, an internal circuit section 43, and an output circuit section 45 wherein memory cell array section 41 and the internal circuit section 43 will be skipped herein for the purpose of avoiding redundancy.

The output circuit section 45 includes two output transistors 11 consisting of a PMOS transistor and an NMOS transistor. The output transistor consisting of the PMOS transistor is connected to a protecting transistor consisting of an NMOS transistor, and the output transistor consisting of the NMOS transistor is coupled with a protecting transistor consisting of a PMOS transistor in a predetermined connecting manner according to the present invention, respectively.

In this application example, there is no increase of the occupied area of the protecting transistor, and the manufacturing process is not modified, thereby achieving the DRAM with an improved resistance against the electrostatic breakdown. According to the present invention as described above, in the semiconductor device having a first conductive type of MOS transistor with one side of a source-drain region connected to an output terminal, it is possible to form an electrostatic breakdown preventing circuit(protecting transistor), through the use of the second conductive transistor switching device is connected such that one of its ends is connected to the output terminal, the switching device itself is coupled with the output transistor in a parallel form, and its gate (or base) is connected to a potential which can put the protecting transistor to a turned-off state during the normal operation.

Therefore, in the case where a reverse electrostatic surge is supplied to the output terminal in the semiconductor device, the second conductive transistor semiconductor switching device is activated at a voltage level of the electrostatic surge which is below the breakdown voltage in the output transistor, to thereby lower the influence of the reverse electrostatic surge to the output transistor.

Furthermore, the present invention has advantages that the occupied area of the semiconductor switching device maybe reduced as much as the lowering of the operating voltage, and since the semiconductor device can be manufactured by using the prior art semiconductor manufacturing process, it can be less prone to increase the occupied area of the protecting transistor and to alter the manufacturing process, thereby obtaining an improved resistance against the electrostatic breakdown in comparison with the conventional semiconductor device.

While the present invention has been shown and described in connection with the preferred embodiments only, it will be apparent to those of ordinary skill in the art that many changes and modifications may be made without departing from the spirit and scope of the invention as defined in the appended claims.

What is claimed is:

1. A semiconductor device comprising:
    an output transistor having a first conductive type with one of a source and a drain thereof connected to an output terminal of the semiconductor device, and the other of the source and drain thereof connected to a first power supply; and
    a circuit preventing an electrostatic breakdown for protecting the output transistor from the electrostatic breakdown introduced by an electrostatic surge current;

wherein said circuit comprises a semiconductor transistor having a second conductive type and including a first impurity layer which is a first electrode of the second conductive type connected to the first power supply, a second impurity layer which is a second electrode of the second conductive type connected to the output terminal, and a third electrode, so that said circuit is connected across said output transistor between the first power supply and the output terminal.

2. The device as claimed in claim 1, wherein said semiconductor device is a semiconductor memory device.

3. The device as claimed in claim 1, wherein said semiconductor transistor further comprises a structure for reducing a heating introduced by the electrostatic surge current.

4. The device as claimed in claim 3, wherein said semiconductor transistor comprises a bipolar transistor, and said structure for reducing heating comprises a collector junction, the junction area thereof being designed taking into account a magnitude of the heating, and said third electrode is a base of the first conductive type.

5. The device as claimed in claim 4, wherein a distance from a connecting junction between a collector and the conductive layer connected with said collector to an inside of said collector region is made not to be affected by a diffusion of the conductive layer depending on heating introduced by the electrostatic surge current.

6. The device as claimed in claim 3, wherein said semiconductor transistor is a MOS transistor and said third electrode is a gate, and wherein a distance from a connecting junction between a first source-drain region other than a second source-drain region connected to said output terminal, and the conductive layer connected with said first source-drain region, to one side of the gate in the source-drain region, is made not to be affected by diffusion of wiring metal depending on the heating of an electrostatic surge current.

7. The device as claimed in claim 1, wherein said circuit further comprises a resistive element for suppressing an inputting of an electrostatic surge current into said output transistor;

wherein said resistive element is disposed between said output transistor and a connecting junction; and said connecting junction is connected to at least one of said output terminal, said first power supply, and said semiconductor transistor.

8. The device as claimed in claim 7, wherein said semiconductor transistor further comprises a structure for reducing a heating introduced by the electrostatic surge current, wherein said semiconductor transistor is a bipolar transistor, and wherein said structure for reducing heating is a collector junction, the junction area thereof being designed taking into account a magnitude of the heating.

9. The device as claimed in claim 8, wherein a distance from a connecting junction between a collector and the conductive layer connected with said collector to an inside of said collector region is made not to be affected by a diffusion of the conductive layer depending on the heating introduced by the electrostatic surge current.

10. The device as claimed in claim 7, wherein said semiconductor transistor is a MOS transistor and said third electrode is a gate, and wherein a distance from a connecting junction between a first source-drain region other than a second source-drain region connected to said output terminal, and the conductive layer connected with said first source-drain region, to one side of the gate in the source-drain region, is made not to be affected by diffusion of wiring metal depending on the heating of an electrostatic surge current.

11. The device as claimed in claim 1, wherein said semiconductor transistor is a bipolar transistor with an emitter and a collector which function as said impurity layers having a second conductive type, and with a base connected to a potential which allows said semiconductor transistor to turn off.

12. The device as claimed in claim 11, wherein said semiconductor device is a semiconductor memory device.

13. The device as claimed in claim 11, wherein said circuit further comprises a resistive element for suppressing an inputting of an electrostatic surge current into said output transistor;

wherein said resistive element is disposed between said output transistor and a connecting junction; and said connecting junction is connected to at least one of said output terminal, said first power supply, and said semiconductor transistor.

14. The device as claimed in claim 13, wherein a distance from a connecting junction between a collector and the conductive layer connected with said collector to an inside of said collector region is made not to be affected by a diffusion of the conductive layer depending on the heating introduced by the electrostatic surge current.

15. The device as claimed in claim 11, wherein said semiconductor transistor comprises a structure for reducing a heating introduced by the electrostatic surge current.

16. The device as claimed in claim 15, wherein a distance from a connecting junction between a collector and the conductive layer connected with said collector to an inside of said collector region is made not to be affected by a diffusion of the conductive layer depending on the heating introduced by the electrostatic surge current.

17. The device as claimed in claim 1, wherein said semiconductor transistor is a MOS transistor having the second conductive type with a gate which is said third electrode connected to a potential which allows said semiconductor transistor to turn off during the normal operation.

18. The device as claimed in claim 17, wherein said semiconductor device is a semiconductor memory device.

19. The device as claimed in claim 17, wherein said circuit further comprises a resistive element for suppressing an inputting of an electrostatic surge current into said output transistor;

wherein said resistive element is disposed between said output transistor and a connecting junction; and said connecting junction is connected to at least one of said output terminal, said first power supply, and said semiconductor transistor.

20. The device as claimed in claim 19, wherein a distance from a connecting junction between a first source-drain region other than a second source-drain region connected to said output terminal, and the conductive layer connected with said first source-drain region, to one side of the gate in the source-drain region is made not to be affected by diffusion of the wiring metal depending on the heating of an electrostatic surge current.

21. The device as claimed in claim 17, wherein said semiconductor transistor comprises a structure for reducing a heating introduced by the electrostatic surge current.

22. The device as claimed in claim 21, wherein a distance from a connecting junction between a first source-drain region other than a second source-drain region connected to said output terminal and the conductive layer connected with said first source-drain region to one side of the gate in the source-drain region is made not to be affected by diffusion of the wiring metal depending on the heating of an electrostatic surge current.

23. The device as claimed in claim 17, wherein a width of the gate of said semiconductor transistor is wider than a width of the gate of said output transistor.

24. The device as claimed in claim 1, wherein the third electrode is connected to a potential such that said semiconductor transistor is in an off state when the electrostatic surge current is not present.

25. A semiconductor device comprising:
a first output transistor of a first conductive type connected to an output terminal and a first power supply;
a second output transistor of a second conductive type connected to said output terminal and a second power supply; and
a first circuit preventing an electrostatic breakdown for protecting said first output transistor when an electrostatic surge current is present;
wherein said first circuit is a first semiconductor transistor of the second conductive type connected across said first output transistor, a first electrode of said first semiconductor transistor being connected to said output terminal, a second electrode of said first semiconductor transistor being connected to said first power supply, and said first semiconductor transistor including a third electrode.

26. The device as claimed in claim 25, wherein said first circuit further comprises a resistive element for preventing an electrostatic surge on a connecting junction;
wherein said resistive element is disposed between said first output transistor and said connecting junction; and
said connecting junction is connected to at least one of said output terminal, said first power supply, said second power supply, and said first semiconductor transistor.

27. The device as claimed in claim 25, wherein said first circuit further comprises a resistive element for suppressing an electrostatic surge current on a connecting junction;
wherein said resistive element is disposed between said first output transistor and said connecting junction; and
said connecting junction is connected to at least one of said output terminal, said first power supply, said second power supply, and said first semiconductor transistor.

28. The device as claimed in claim 25, wherein said first semiconductor transistor comprises a MOS transistor having the second conductive type, with a gate which is said third electrode of said first semiconductor transistor of said MOS transistor connected to said second power supply which allows said first semiconductor transistor to be in an off state, and with a structure for suppressing a heating introduced by the electrostatic surge current.

29. The device as claimed in claim 28, wherein in the structure for suppressing the heating of the second conductive MOS transistor, a distance from a connecting junction between the source-drain region other than the source-drain region connected to said output terminal of said semiconductor device and the conductive layer connected thereto to one side of the gate in the source-drain region is made not to be affected by a diffusion of the conductive layer depending on the heating introduced by the electrostatic surge current.

30. The device as claimed in claim 28, wherein a width of the gate of said first semiconductor transistor is wider than a width of the gate of said first output transistor.

31. The device as claimed in claim 25, wherein said first semiconductor transistor comprises a bipolar transistor with an emitter-collector which acts as a semiconductor layer having a second conductive type and a base of said bipolar transistor connected to said second power supply which allows turning off said first semiconductor transistor, and with a collector junction area designed by taking into account the heating.

32. The device as claimed in claim 31, wherein in the bipolar transistor, a distance from a connecting junction between the collector and the conductive layer connected with said collector to an inside of said collector region is made not to be affected by a diffusion of the wiring metal depending on the heating introduced by the electrostatic surge current.

33. The device as claimed in claim 25, wherein said semiconductor device is a semiconductor memory device.

34. The device as claimed in claim 25, further comprising:
a second circuit preventing an electrostatic breakdown for protecting said second output transistor;
wherein said second circuit is a second semiconductor transistor of the first conductive type connected across said second output transistor, a first electrode of said second semiconductor transistor being connected to the output terminal, a second electrode of said second semiconductor transistor being connected to the second power supply, and a third electrode of said second semiconductor transistor being connected to said first power supply, wherein said first power supply allows said second semiconductor transistor be in an off state.

35. The device as claimed in claim 34, wherein said second circuit further comprises a resistive element for preventing electrostatic surge from a connecting junction;
said resistive element being disposed between said second output transistor and said connecting junction; and
said connecting junction is connected to at least one of said output terminal, said first power supply, said second power supply, said first semiconductor transistor, and said second semiconductor transistor.

36. The device as claimed in claim 34, wherein said second circuit further comprises a resistive element for suppressing an electrostatic surge current on a connecting junction;
said resistive element being disposed between said second output transistor and said connecting junction; and
said connecting junction is connected to at least one of said output terminal, said first power supply, said second power supply, said first semiconductor transistor, and said second semiconductor transistor.

37. The device an claimed in claim 34, wherein said second semiconductor transistor conductive a MOS transistor having the first conductive type, with a gate which is said third electrode of said MOS transistor being connected to said first power supply, which allows said second semiconductor transistor to be in an off state, and with a structure for suppressing a heating introduced by the electrostatic surge current.

38. The device as claimed in claim 37, wherein in the structure for suppressing the heating of the second conductive MOS transistor, a distance from a connecting junction between the source-drain region other than the source-drain region connected to said output terminal of said semiconductor device and the conductive layer connected thereto, to one side of the gate in the source-drain region is made not to be affected by a diffusion of the conductive layer depending on the heating introduced by the electrostatic surge current.

39. The device as claimed in claim 37, wherein said first semiconductor transistor comprises a bipolar transistor, with an emitter-collector which acts as a semiconductor layer having a second conductive type, a base of said bipolar transistor connected to said second power supply which allows turning off said first semiconductor transistor, and with a collector junction area designed by taking into account the heating.

40. The device as claimed in claim 37, wherein said first semiconductor transistor comprises a MOS transistor having a second conductive type, with a gate of said MOS transistor connected to said second power supply which allows said first semiconductor transistor to turn off, and with a structure for suppressing a heating introduced by the electrostatic surge current.

41. The device as claimed in claim 37, wherein a width of the gate of said second semiconductor transistor is wider than a width of the gate of said second output transistor.

42. The device as claimed in claim 34, wherein said second semiconductor transistor comprises a bipolar transistor with an emitter-collector which acts as a semiconductor layer having the first conductive type, a base which is said third electrode of said bipolar transistor connected to said first power supply which allows said second semiconductor transistor to be in an off state, and with a collector junction area designed by taking into account the heating.

43. The device as claimed in claim 42, wherein in the bipolar transistor, a distance from a connecting junction between the collector and the conductive layer connected with said collector, to an inside of said collector region is made not to be affected by a diffusion of the wiring metal depending on the heating introduced by the electrostatic surge current.

44. The device as claimed in claim 42, wherein said first semiconductor transistor comprises a bipolar transistor with an emitter-collector which acts as a semiconductor layer having a second conductive type, a base of said bipolar transistor connected to said second power supply which allows turning off said first semiconductor transistor, and with a collector junction area designed by taking into account the heating.

45. The device as claimed in claim 42, wherein said first semiconductor transistor comprises a MOS transistor having a second conductive type, with a gate of said MOS transistor connected to said second power supply which allows said first semiconductor transistor to turn off, and with a structure for suppressing a heating introduced by the electrostatic surge current.

46. The device as claimed in claim 34, wherein said first semiconductor transistor comprises a MOS transistor having the second conductive type, with a gate which is said third electrode of said MOS transistor being connected to said second power supply which allows said first semiconductor transistor to turn off, and with a structure for suppressing a heating introduced by the electrostatic surge current.

47. The device as claimed in claim 46, wherein said second conductive MOS transistor is said first semiconductor transistor, and wherein in the structure for suppressing the heating of the second conductive MOS transistor is disposed a distance from a connecting junction between the source-drain region other than the source-drain region connected to said output terminal of said semiconductor device and the conductive layer connected thereto, and to one side of the gate in the source-drain region, is made not to be affected by a diffusion of the conductive layer depending on the heating introduced by the electrostatic surge current.

48. The device as claimed in claim 34, wherein said first semiconductor transistor comprises a bipolar transistor with an emitter-collector which acts as a semiconductor layer having a second conductive type, a base of said bipolar transistor connected to said second power supply which allows turning off said first semiconductor transistor, and with a collector junction area designed by taking into account the heating.

49. The device as claimed in claim 48, wherein in the bipolar transistor of said first semiconductor transistor, disposed a distance from a connecting junction between the collector and the conductive layer connected with said collector, and to an inside of said collector region, is made not to be affected by a diffusion of the wiring metal depending on the heating introduced by the electrostatic surge current.

50. The device as claimed in claim 25, wherein the third electrode of said first semiconductor transistor is connected to said second power supply, wherein said second power supply allows said first semiconductor transistor to be in an off state when an electrostatic surge current is not present.

* * * * *

UNITED STATES PATENT AND TRADEMARK OFFICE
CERTIFICATE OF CORRECTION

PATENT NO. : 5,850,094

DATED : December 15, 1998

INVENTOR(S) : Katsuhiro Kato, et al

It is certified that error appears in the above-identified patent and that said Letters Patent is hereby corrected as shown below:

Column 13, line 8, please delete "across" and insert --to--;

Column 13, line 8, after "transistor" insert --in parallel--.

Signed and Sealed this

Second Day of March, 1999

*Attest:*

Q. TODD DICKINSON

*Attesting Officer*   Acting Commissioner of Patents and Trademarks